(12) United States Patent
Kim et al.

(10) Patent No.: US 8,987,610 B2
(45) Date of Patent: Mar. 24, 2015

(54) VENT STRUCTURE FOR ELECTROMAGNETIC SHIELDING

(75) Inventors: Ui-Jung Kim, Daejeon (KR);
Kwang-Uk Chu, Daejeon (KR);
Jong-Kyu Kim, Daejeon (KR);
Dae-Heon Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 347 days.

(21) Appl. No.: 13/466,422

(22) Filed: May 8, 2012

(65) Prior Publication Data

US 2013/0175082 A1    Jul. 11, 2013

(30) Foreign Application Priority Data

Jan. 6, 2012  (KR) ......................... 10-2012-0002054

(51) Int. Cl.
*H05K 9/00*    (2006.01)

(52) U.S. Cl.
USPC ......................................................... 174/383

(58) Field of Classification Search
CPC .................................................. H05K 9/0041
USPC ........................................................ 174/383
See application file for complete search history.

(56) References Cited

U.S. PATENT DOCUMENTS

| 3,553,343 A * | 1/1971 | Garlington ................... 174/383 |
| 3,584,134 A * | 6/1971 | Nichols et al. ............... 174/383 |
| 4,249,033 A * | 2/1981 | Darakjy et al. .............. 174/16.1 |
| 4,678,716 A * | 7/1987 | Tzeng ........................... 428/551 |
| 4,841,692 A * | 6/1989 | Coupard et al. .................... 52/3 |
| 4,872,090 A * | 10/1989 | Taylor et al. .................. 361/818 |
| 5,401,914 A | 3/1995 | Curran et al. |
| 6,297,446 B1 | 10/2001 | Cherniski et al. |
| 2002/0090506 A1 * | 7/2002 | Protzner et al. ............... 428/334 |

FOREIGN PATENT DOCUMENTS

| JP | 08-186394 A | 7/1996 |
| JP | 1996-186394 A | 7/1996 |
| KR | 10-2003-0080971 A | 10/2003 |
| KR | 10-0990828 B1 | 10/2010 |
| KR | 10-2010-0132615 A | 12/2010 |

* cited by examiner

*Primary Examiner* — William H Mayo, III
*Assistant Examiner* — Hiram E Gonzalez
(74) *Attorney, Agent, or Firm* — LRK Patent Law Firm

(57) ABSTRACT

A vent structure for electromagnetic shielding includes: a conductive shielding case having a vent formed therein: a conductive shielding duct installed on the shielding case so as to cover the vent, including a space formed perpendicular to the direction of motion of air discharged from the vent to vent the air and a discharge port connected from the space to the outside to discharge the air introduced into the space to the outside, and shielding electromagnetic waves; and an EMI (Electro Magnetic Interference) gasket installed at a bonding surface between the shielding case and the shielding duct, and electrically connecting the shielding case and the shielding duct.

3 Claims, 10 Drawing Sheets

(a)

(b)

VENT STRUCTURE FOR ELECTROMAGNETIC SHIELDING

CROSS-REFERENCE TO RELATED APPLICATION

This application claims priority to Korean Patent Application No. 10-2012-0002054 filed on Jan. 6, 2012, which is incorporated herein by reference in its entirety.

BACKGROUND OF THE INVENTION

1. Field of the Invention

Exemplary embodiments of the present invention relate to a vent structure for electromagnetic shielding; and, particularly, to a vent structure for electromagnetic shielding, which is conveniently mounted on a case of an electronic device, protects the electronic device by radiating heat generated inside the electronic device to the outside, and effectively attenuates electromagnetic waves generated inside the electronic device.

2. Description of Related Art

Electromagnetic waves are generated while an electromagnetic field, the intensity of which periodically changes, propagates in space.

Recently, with the development of communication technology, various electronic devices, ranging from small-sized electronic devices to middle and large-sized electronic devices, such as mobile phones, digital cameras, computers, and navigation devices, have been used in our daily lives.

Electromagnetic waves generated from such electronic devices have an effect on other electronic devices, and have become a factor that causes malfunction of devices due to mutual interference of electromagnetic waves between adjacent circuits.

Furthermore, as the spread of electromagnetic application devices rapidly increases, ordinary people, as well as workers in the manufacturing sector of electronic devices, are more frequently exposed to electromagnetic waves. Electromagnetic waves generated from an electronic device may have a bad influence on the human body. For example, electromagnetic waves may increase the temperature of tissue cells through a thermal effect, thereby weakening the immune function or causing genetic mutations.

For example, there is a report saying that microwave leakage from microwave ovens may cause cataracts or breast cancer, and there is a research result saying that electromagnetic waves from mobile phones may cause brain tumors or leukemia. In addition, there are many reports saying that electromagnetic waves may cause hypertension, headaches, or memory failure.

Therefore, the demand for an electromagnetic shielding structure, which prevents electromagnetic waves generated inside an electronic device from being discharged outside, or prevents electromagnetic waves from the outside from being propagated into a system, is gradually increasing.

FIG. 1 illustrates a vent for shielded enclosures disclosed in U.S. Pat. No. 5,401,914. In the vent for shielded enclosures, a waveguide having a small opening size is formed by inserting separate conductor plates 30, 32, 34, and 36 into a waveguide structure 25 through which the air passes, and the waveguide structure 25 is assembled into a structure for electromagnetic shielding through separate screws, thereby shielding electromagnetic waves while circulating internal and external air.

The structure of FIG. 1 relates to a vent for electromagnetic shielding having a pipe, which includes partitions or dividers, and a mounting plate or flange. The mounting plate or flange is a structure for connecting the shielding structure and the vent, and the partitions inside the pipe serve to divide the inner diameter of the pipe, through which electromagnetic waves and air pass, into dimensions required for attenuating the electromagnetic waves.

The pipe has a length such that it protrudes from the mounting plate or flange, and the pipe length may be larger than the inner diameter of the pipe. The mounting plate may be assembled to be electrically connected to the electromagnetic shielding structure, and may satisfy the continuity of the electromagnetic shielding structure. The air circulation between the inside and outside of the electromagnetic shielding structure may be performed through the pipe including the partitions, and the partitions inside the pipe may be assembled to divide all or a part of the pipe. In this case, the partitions inside the pipe may divide the inside of the pipe into four parts, while crossing each other at right angles. The diameter of the pipe, divided by the partitions inside the pipe, becomes smaller than the outer pipe diameter, and the entire length of the pipe may be shortened by the installation of the partitions, compared to when no partitions are installed. That is because the pipe diameter is reduced by the partitions installed inside the pipe, and the pipe length required for reducing electromagnetic waves is shortened by the reduction of the pipe diameter. In general, a pipe length which is four to five times as large as a pipe diameter is required to attenuate electromagnetic waves.

FIG. 2 illustrates a high performance EMC vent panel disclosed in U.S. Pat. No. 6,297,446. The high performance EMC vent is characterized in that a plurality of conducting plates 17 and 18, having a plurality of openings 11 therein, are stacked to be electrically connected to each other, and in that the openings in each conducting plate form a waveguide having a thickness suitable for shielding electromagnetic waves.

The structure of FIG. 2 relates to a vent for electromagnetic shielding, in which the plurality of conducting plates, each having the plurality of openings therein, are stacked to thus have a multilayered structure, and are electrically connected to form a waveguide structure capable of attenuating electromagnetic waves.

Since the waveguide structure formed by electrically connecting the plurality of conducting plates is used, the waveguide is thicker than a vent for electromagnetic shielding using a single conducting plate. Furthermore, the opening size may be designed to have a large value, due to electromagnetic wave attenuation characteristics based on the thickness of the waveguide.

In the structure of FIG. 2, the openings of the conducting plates forming the multilayered structure are aligned to have the same center, and form a path through which the air passes, and the conducting plates are electrically connected through a rivet or gasket positioned outside the conducting plates.

The above-described vents for electromagnetic shielding are designed to provide a path having a predetermined thickness such that electromagnetic waves are attenuated while propagating. In the case of FIG. 1, the opening through which the air passes is divided by the crossed partitions installed inside the circular waveguide. In the case of FIG. 2, the openings are formed by stacking the plurality of conducting plates having openings with a predetermined shape. The shielding performance of the vents for electromagnetic shielding is determined by the size of the opening and the length of the waveguide.

Therefore, in order to shield electromagnetic waves having a high frequency, the size of the opening through which the air passes should be set to a small value, and the thickness of the waveguide should be increased. In order to reduce the size of the opening through which the air passes or increase the thickness of the waveguide, the diameter of the circular waveguide should be decreased, and the thickness thereof should be increased, as in the case shown in FIG. 1. Furthermore, in the case of FIG. 2, the size of the opening in each conducting plate forming the multilayered structure should be decreased, and the thickness of the conducting plate or the number of conducting plates should be increased.

FIG. 3 illustrates a honeycomb vent panel for a vent for electromagnetic shielding, which is commercially sold by Holland Shielding System B.V. The honeycomb vent panel includes a frame 50 which is electrically connected to a honeycomb 40 having a shape similar to a honeycomb structure. In general, the honeycomb 40 includes a plurality of hexagonal cells having a predetermined thickness and positioned adjacent to each other, and the frame 50 is used for connecting the shielding structure to the honeycomb 40. Since the honeycomb, the frame, and the shielding structure must be electrically connected, conductive gaskets suitable for the respective connection portions are used. The honeycomb assembled to the frame is engaged with the electromagnetic shielding structure, and is used as a path through which the air is circulated.

In the case of the honeycomb used as a ventilation window having an electromagnetic shielding function, a waveguide four to five times longer than the maximum diameter of an opening is formed to a predetermined thickness such that electromagnetic waves are attenuated while passing through the waveguide. Furthermore, the thickness of the honeycomb should be increased in proportion with the opening size.

In the case of the commercial honeycomb, various products are sold according to the required electromagnetic shielding performance. Therefore, a suitable product may be selectively applied depending on the application. However, an assembly process using a frame suitable for a shielding structure to be applied is necessary, and a separate conductive gasket for electrical connection between the frame and the shielding structure must be included in a coupling portion and assembled.

SUMMARY OF THE INVENTION

An embodiment of the present invention is directed to a vent structure for electromagnetic shielding, which includes a conductive shielding duct which is electrically connected to a conductive shielding case having a vent formed therein so as to cover the vent, and includes a space formed perpendicular to the direction of motion of the air discharged from the vent to ventilate the air and a discharge port connected from the space to the outside to discharge the air introduced into the space.

The space in the shielding duct is formed in a rectangular shape extending in one direction such that the discharge port is spaced apart from the vent. Therefore, as the distance that the air containing electromagnetic waves is moved is increased, the discharge of electromagnetic waves outside may be reduced.

Another embodiment of the present invention is directed to a vent structure for electromagnetic shielding, including an electromagnetic wave absorption member provided on the inner surface of the shielding duct, in order to further improve the electromagnetic shielding performance.

Another embodiment of the present invention is directed to a vent structure for electromagnetic shielding, including a plurality of shielding ducts which are stacked in a zigzag manner to increase the distance along which the air is ventilated, in order to further improve the electromagnetic shielding performance.

Another embodiment of the present invention is directed to a vent structure for electromagnetic shielding, including primary and secondary shielding ducts which are installed inside and outside of a shielding case so as to face each other around the vent, in order to improve the electromagnetic shielding performance.

Other objects and advantages of the present invention can be understood from the following description, and will become apparent with reference to the embodiments of the present invention. Also, it will be obvious to those skilled in the art to which the present invention pertains that the objects and advantages of the present invention can be realized by the means as claimed and combinations thereof.

In accordance with an embodiment of the present invention, a vent structure for electromagnetic shielding includes: a conductive shielding case having a vent formed therein; a conductive shielding duct installed on the shielding case so as to cover the vent, including a space formed perpendicular to the direction of motion of air discharged from the vent to vent the air and a discharge port connected from the space to the outside to discharge the air introduced into the space to the outside, and shielding electromagnetic waves; and an EMI (Electro Magnetic Interference) gasket installed at the bonding surface between the shielding case and the shielding duct and electrically connecting the shielding case and the shielding duct.

The shielding duct may be formed in a rectangular shape, in which the space is extended in one side direction such that the discharge port is spaced apart from the vent.

The shielding duct may further include an electromagnetic wave absorption member provided on the inner surface thereof.

The shielding duct may include a plurality of shielding ducts which are stacked and installed in a zigzag manner such that spaces thereof are connected to each other.

In accordance with another embodiment of the present invention, a vent structure for electromagnetic shielding includes: a conductive shielding case having a vent formed therein: a primary shielding duct installed inside the shielding case so as to cover the vent, having one side surface open in a direction perpendicular to the vent to form an introduction port through which air inside the shielding case is introduced, and including a first path formed to ventilate the air introduced into the introduction port in a direction perpendicular to the air discharged to the vent; a secondary shielding duct installed outside the shielding case so as to cover the vent, including a second path formed to ventilate the air in a direction perpendicular to the direction of the air discharged from the vent, and having a discharge port formed in one end of the second path so as to discharge the air introduced to the second path to the outside; and an EMI gasket installed at bonding surfaces between the shielding case and the primary and secondary shielding ducts and electrically connecting the shielding case and the primary and secondary shielding ducts.

The introduction port of the primary shielding duct and the discharge port of the secondary shielding duct may be installed to face each other.

The primary and secondary shielding ducts may be formed in a rectangular shape where the first and second paths are extended in the longitudinal direction thereof.

DESCRIPTION OF SPECIFIC EMBODIMENTS

Figure 1:
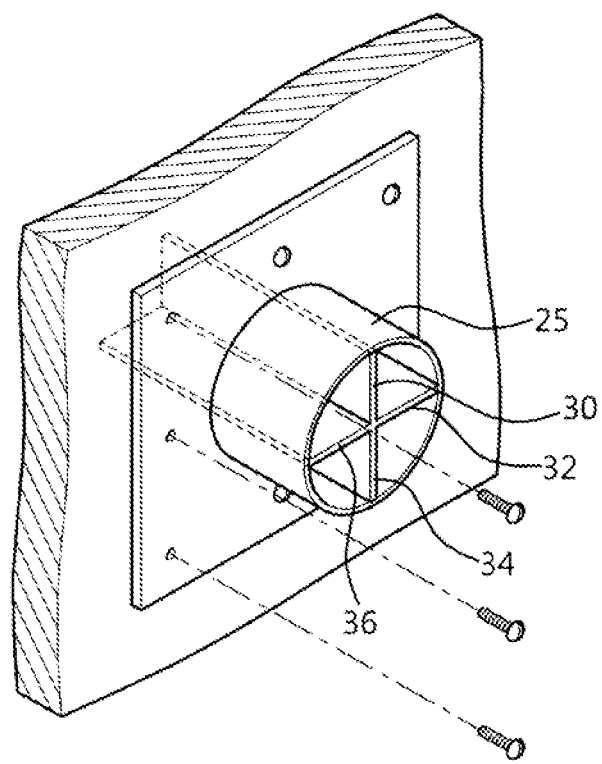
FIG. 1 illustrates a conventional vent for electromagnetic shielding.
Figure 2:
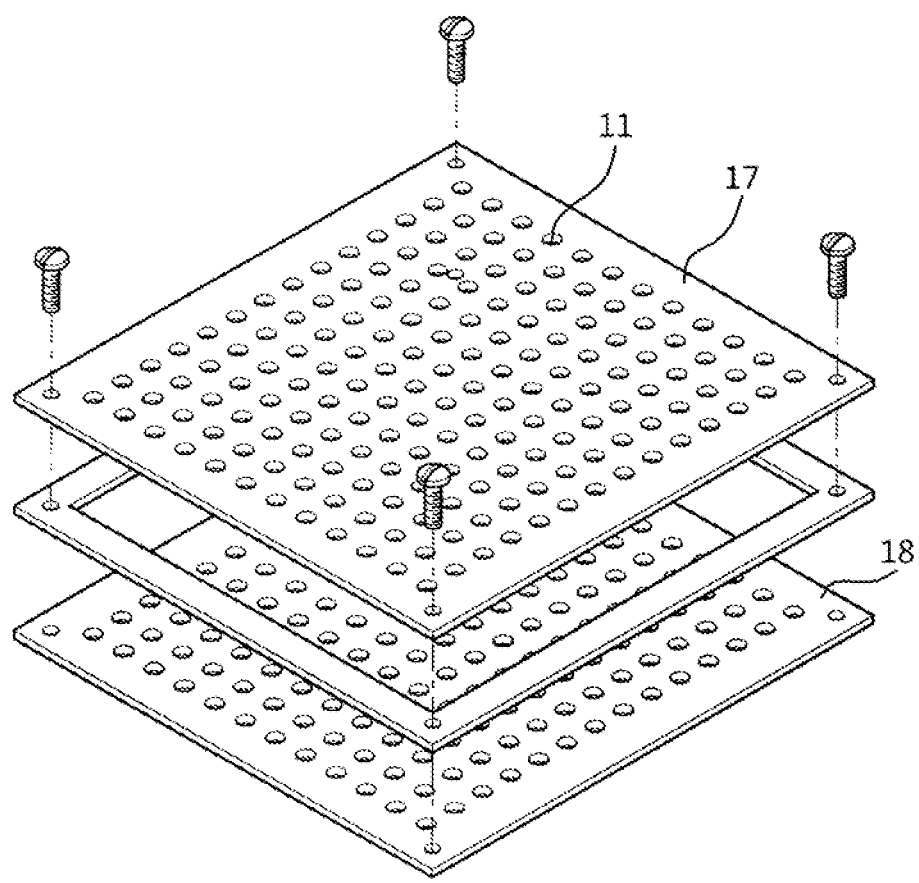
FIG. 2 illustrates another conventional vent structure for electromagnetic shielding.
Figure 3:
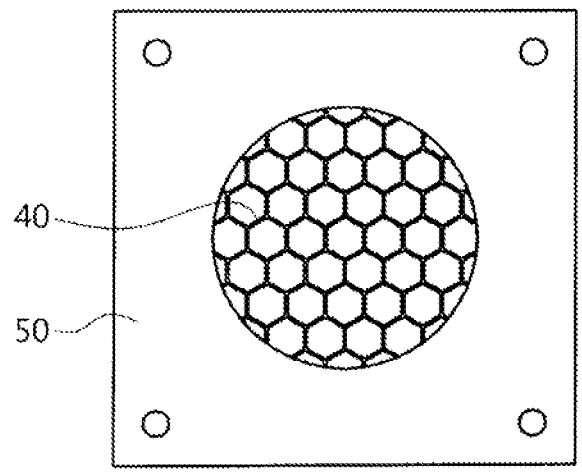
FIG. 3 illustrates a honeycomb vent panel for a vent for electromagnetic shielding, which is commercially sold by Holland Shielding System B.V.
Figure 3:
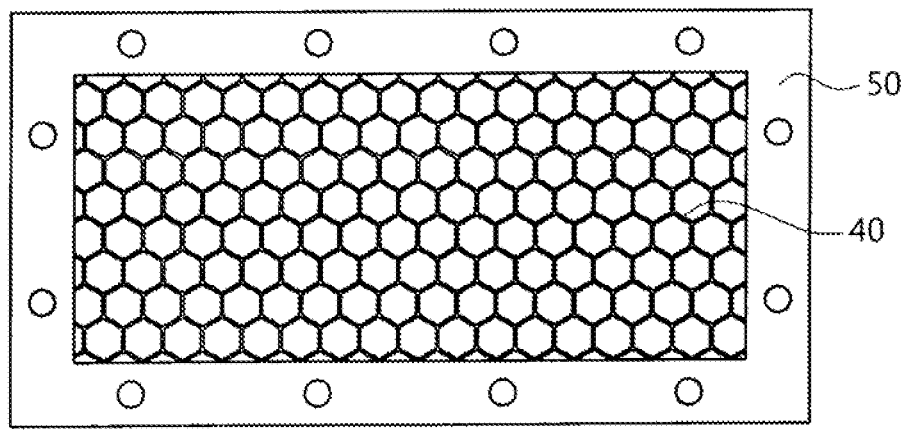
Figure 4:
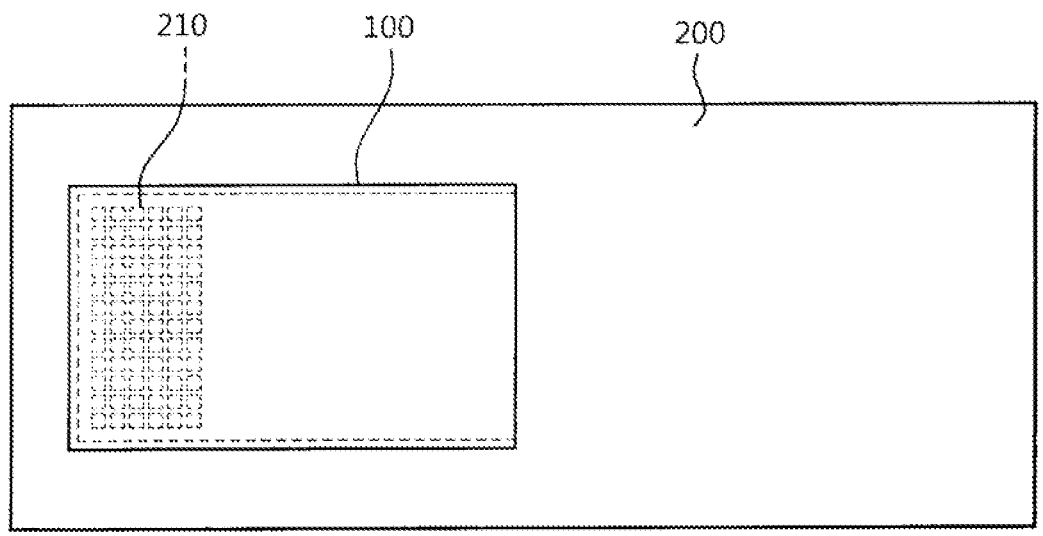
FIG. 4 illustrates an inner surface of a shielding case in accordance with an embodiment of the present invention.

Exemplary embodiments of the present invention will be described below in more detail with reference to the accompanying drawings. The present invention may, however, be embodied in different forms, and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Referring to FIGS. 4 to 8, a vent structure for electromagnetic shielding in accordance with an embodiment of the present invention includes a conductive shielding case 200 having a vent 210 formed therein, a conductive shielding duct 100, and an EMI (Electro Magnetic Interference) gasket 300 installed at the bonding surface between the shielding case 200 and the shielding duct 100 and electrically connecting the shielding case 200 and the shielding duct 100. The shielding duct 100 is installed on the shielding case 200 so as to cover the vent 210, includes a space 110 formed perpendicular to the direction of motion of the air discharged from the vent 210 to ventilate the air, and a discharge port 130 connected from the space 110 to the outside to discharge the air introduced into the space 110, and serves to shield electromagnetic waves.

The shielding case 200 serves to prevent noise generated from inside an electronic device from being emitted outside the case, and to prevent noise from being introduced into the electronic device from outside.

At this time, when the noise generated inside the electronic device is a low-frequency magnetic field, magnetic shielding, i.e., a material having high permeability, may be used, and when the noise is a high-frequency magnetic field, a material having high conductivity may be used. Furthermore, in a Fraunhofer region, a material having high conductivity is used to increase a shielding effect by plane waves.

The magnetic shielding is formed of a material having high permeability and obtains an effect by passing a line of magnetic force through a magnetic shielding portion having magnetic resistance. The material may include steel, permalloy, and the like, and exhibits excellent shielding performance as the thickness thereof increases.

The magnetic shielding may be formed by a method of applying a Zn metalizing layer, a plating layer, or conductive paint onto the surface of a metal case or plastic case or a method of applying conductivity to plastics used for a case.

The shielding case 200 surrounds the exterior of the electronic device and includes the vent 210 formed through the shielding case 200, in order to discharge heat generated from inside the shielding case 200 to the outside.

The shielding duct 100 is coupled to the outside of the shielding case 200 so as to cover the vent 210. At this time, the shielding duct 100 and the shielding case 200 are electrically connected.

The space 110 inside the shielding duct 100 is formed perpendicular to the direction of motion of the air discharged from the vent 210 so as to ventilate the air, and the discharge port 130 is connected from the space 110 to the outside so as to discharge the air introduced into the space 110.

That is, the air staying in the shielding case 200 is discharged through the vent 210, collides with the bottom surface of the shielding duct 100 inside the space 110, is guided by the space 110 formed perpendicular to the direction in which the vent 210 is open, and is then discharged through the discharge port 130.

Here, the space 110 is formed in a rectangular shape extending in one direction, and provided in such a manner that the discharge port 130 and the vent 210 are spaced apart from each other. Such a structure may improve electromagnetic shielding performance, and an attenuation coefficient and the electromagnetic shielding performance of the waveguide may be calculated by the following equations.

$$\alpha = \omega(\mu\varepsilon)^{\frac{1}{2}}\left[\left(\frac{f_c}{f}\right)^2 - 1\right]^{\frac{1}{2}}. \quad \text{[Equation 1]}$$

Here, α represents the attenuation coefficient of the waveguide, ω represents an angular frequency, μ represents permeability, ∈ represents permittivity, and $f_c$ represents the cut-off frequency [MHz] of the waveguide.

$$S \cdot E = 17.5\frac{d}{g}\sqrt{1 - \left(\frac{gf}{96659}\right)^2} \quad \text{[Equation 2]}$$

Here, d represents the length (mm) of the waveguide, and g represents the length (mm) of one side of the waveguide.

Equation 1 is used to calculate the electromagnetic wave attenuation inside the waveguide, and Equation 2 is used to calculate the electromagnetic shielding performance as a function of the length of the waveguide.

The waveguide is a kind of transmission line for transmitting electric energy or signals at a high frequency (1 GHz or more), and electromagnetic waves are passed through a tube formed of a conductor such as copper. The waveguide has the characteristics of a high-pass filter, and cannot transmit waves having a larger wavelength than the cutoff wavelength.

The wavelength of waves transmitted along the axis of the waveguide is referred to as a guided wavelength, and is longer than an excitation wavelength.

When waves transmitted inside the waveguide have a low frequency, a transmission line including two copper lines is usually used. However, when the waves are transmitted at a high frequency, the resistance of the copper lines increases, and the dielectric loss of insulating material around the transmission line also increases. Accordingly, since transmission loss increases, the transmission line cannot be used.

Meanwhile, the waveguide transmits waves in a state in which the waves are trapped. Therefore, since electricity is not directly passed to a surrounding conductor, the waveguide has a small resistance loss. Furthermore, since the inside of the waveguide is hollow and filled only with the air, the waveguide has a small dielectric loss.

That is, in this embodiment of the present invention, the shielding duct 100, through which electromagnetic waves generated inside the electronic device move, serves as a waveguide.

Therefore, as is known from Equations 1 and 2, the electromagnetic shielding performance of the shielding duct 100 is determined by the size of the shielding duct 100, through which the air inside the shielding case 200 passes while being discharged to the outside, that is, the cross-sectional area of the space 110 and the length of the space 100 corresponding to the distance from the vent 210 to the discharge port 130 of the shielding duct 100.

That is, the shielding performance increases in proportion to the length d of the shielding duct 100. When the length g of one side of the shielding duct 100 is increased, the length d of the shielding duct 100 may be increased, to thus maintain the same shielding performance as before the length of one side of the shielding duct 100 is increased or improve the shielding performance.

The EMI gasket 300 is installed at the bonding surface between the shielding case 200 and the shielding duct 100, and electrically connects the shielding duct 100 and the shielding case.

Here, EMI refers to electromagnetic interference caused by electromagnetic waves discharged from various devices such as computers and televisions.

The EMI gasket 300 installed at the bonding surface between the shielding case 200 and the shielding duct 100 prevents noise, and electrically connects the shielding case 200 and the shielding duct 100. Accordingly, the air discharged through the vent 210 is discharged through the discharge port 130, and the discharge of electromagnetic waves to the outside with the air is reduced.

Figure 5:
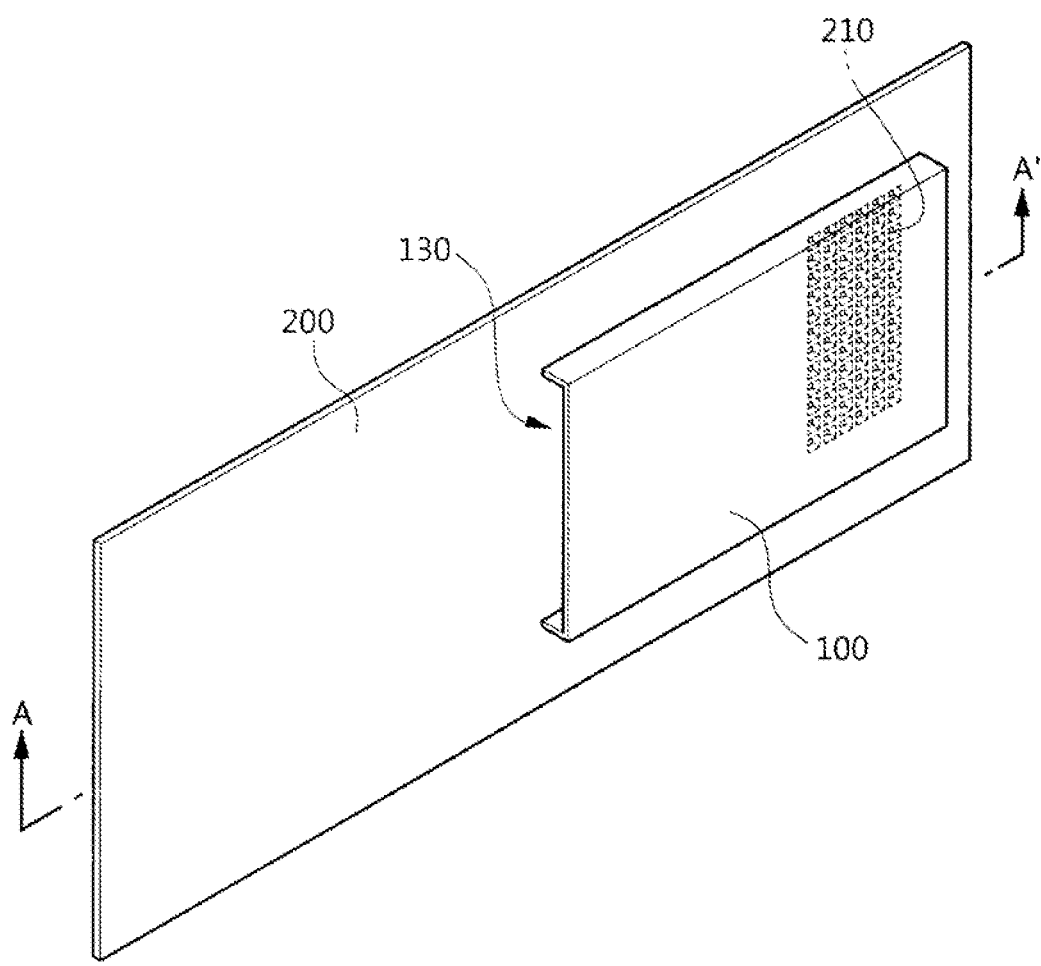
FIG. 5 is a perspective view of the shielding case on which a vent structure for electromagnetic shielding in accordance with the embodiment of the present invention is mounted.
Figure 6:
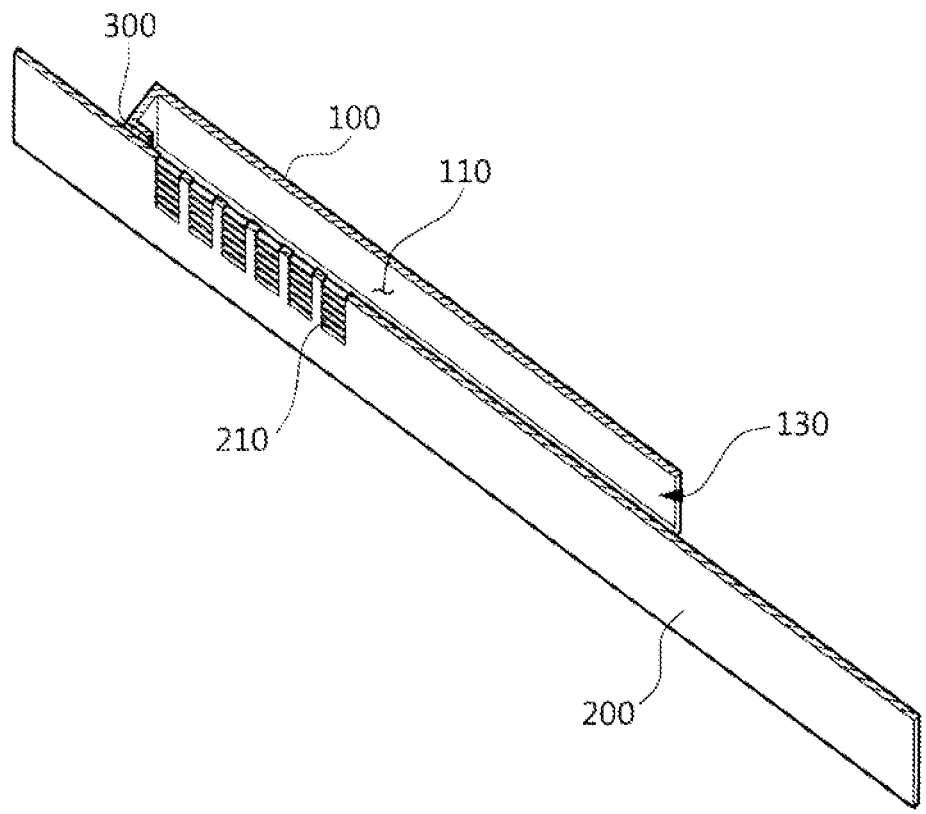
FIG. 6 is a cross-sectional view taken along a line A-A' of FIG. 5.
Figure 7:
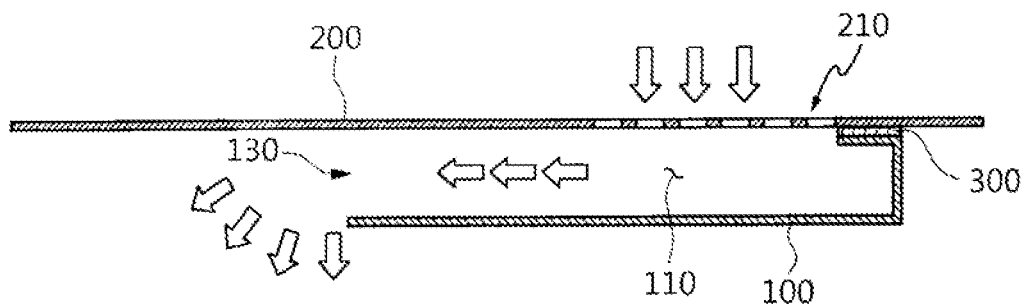
FIG. 7 schematically illustrates a state in which a shielding duct is installed outside the shielding case.
Figure 8:
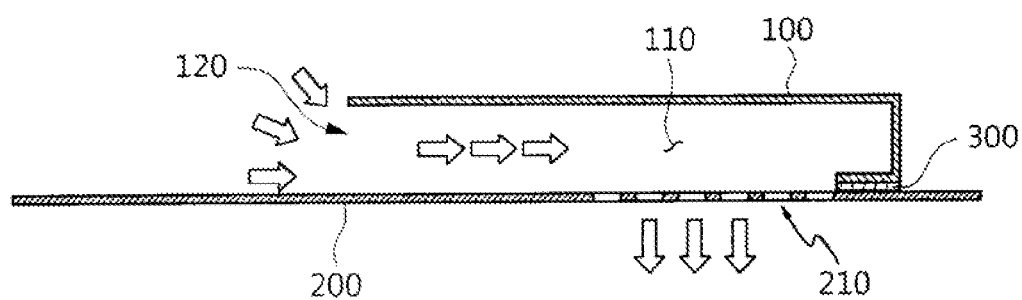
FIG. 8 schematically illustrates a state in which the shielding duct is installed inside the shielding case.

Referring to FIGS. 5 to 7, the shielding duct 100 having a rectangular shape, of which one side surface is open, is mounted on the outer surface of the shielding case 200 so as to cover the vent 210.

Therefore, referring to FIG. 7, when the air heated inside the shielding case 200 and the electromagnetic waves are discharged through the vent 210, the air collides with the top surface of the shielding duct 100 such that the advancing direction thereof is changed to a direction parallel to the outer surface of the shielding case 200, and is then guided to the space 110 in the shielding case 200 and discharged through the discharge port 130.

Furthermore, the electromagnetic waves are attenuated while passing through the shielding duct 100, which is electrically connected to the shielding case 200, by the EMI gasket 300.

Meanwhile, the shielding duct 100 may be installed on the inner surface of the shielding case 200, instead of the outer surface thereof. That is, referring to FIG. 8, when the shielding duct 100 is installed inside the shielding case 200, the shielding duct 100 may attenuate electromagnetic waves without spoiling the appearance of the shielding case 200.

Figure 9:
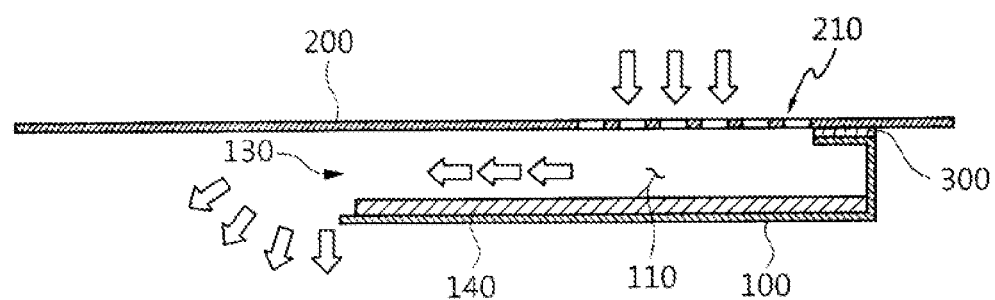
FIG. 9 schematically illustrates a state in which an electromagnetic absorption member is provided on the inner surface of the shielding duct.

Referring to FIG. 9, an electromagnetic wave absorption member 140 may be provided on the inner surface of the shielding duct 100.

The electromagnetic wave absorption member 140 converts electronic energy into a different kind of energy such that the electronic energy is not reflected out, and may be classified into MARA-Series, MASA-Series, MATA-Series, and MABA-Series, MAPA-Series depending on frequency, characteristic, standard size, usage temperature, and shape.

The electromagnetic wave absorption member 140 may be implemented in various types, such as a tile type, a block type, a sheet type, and a liquid type.

Figure 10:
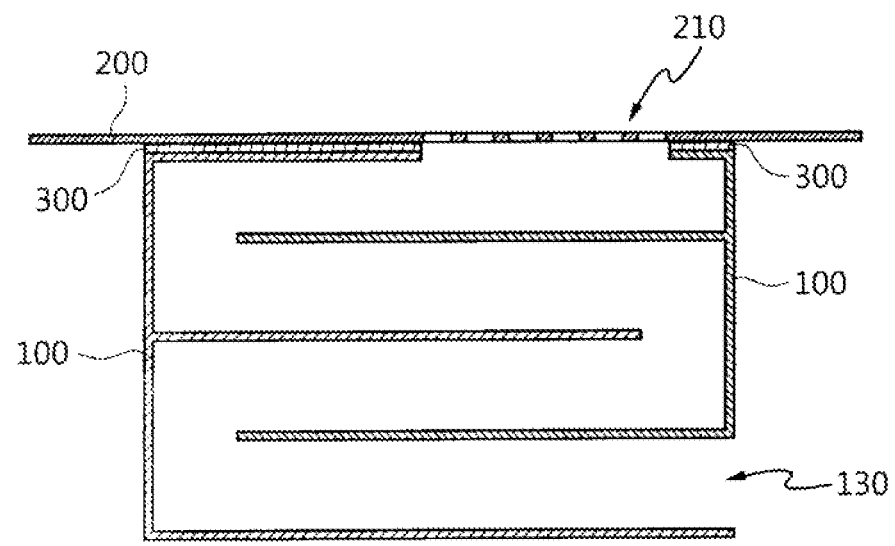
FIG. 10 schematically illustrates a state in which a plurality of shielding ducts are stacked and installed in a zigzag manner.

FIG. 10 illustrates that a plurality of shielding ducts 100 are stacked and installed in a zigzag manner such that the respective spaces 110 thereof are connected to each other, when there is no limits on the space for installing the electronic device. In this case, the distance along which electromagnetic waves move to be discharged to the outside is increased. Therefore, the electromagnetic attenuation ability may be further improved, according to Equations 1 and 2.

Figure 11:
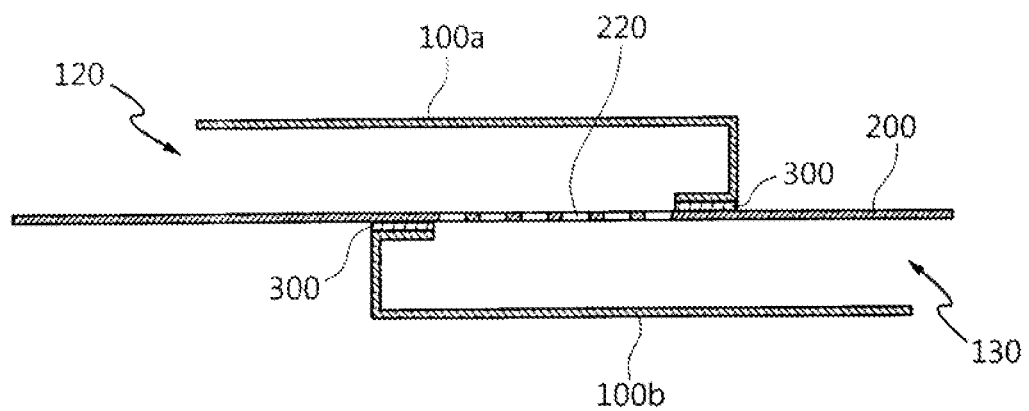
FIG. 11 illustrates a shielding duct in accordance with another embodiment of the present invention.

FIG. 11 illustrates another example of the shielding duct 100 according to the embodiment of the present invention. The shielding duct 100 includes a primary shielding duct 100a and a secondary shielding duct 100b. The primary shielding duct 100a is installed inside the shielding case 200 so as to cover the vent 210, has one surface open in a direction perpendicular to the vent 210 so as to form an introduction port 120 through which the air inside the shielding case 200 is introduced, and includes a first path formed to ventilate the air introduced into the introduction port 120 in a direction perpendicular to the air discharged to the vent 210. The secondary shielding duct 100b is installed outside the shielding case 200 so as to cover the vent 210, includes a second path formed to ventilate the air in a direction perpendicular to the direction of the air discharged from the vent 210, and has a discharge port 130 formed in one end of the second path so as to discharge the air introduced into the second path to the outside. The EMI gasket 300 is installed at bonding surfaces between the shielding case 200 and the primary and secondary shielding ducts 100a and 100b, respectively, and electrically connects the shielding case 200 and the primary and secondary ducts 100a and 100b.

The introduction port 100b of the primary ducts 100a and the discharge port 130 of the secondary ducts 100b may be installed to face each other such that the air inside the shielding case 200 is smoothly discharged.

Figure 12:
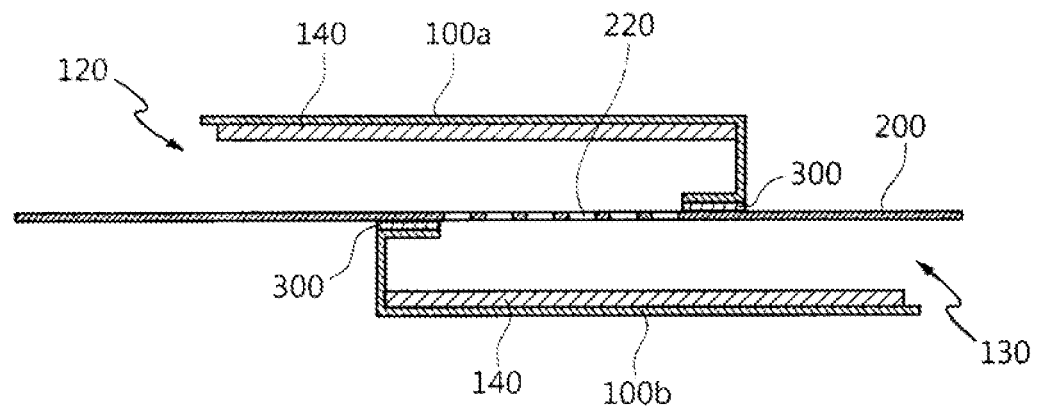
FIG. 12 schematically illustrates a state in which an electromagnetic wave absorption member is installed on the shielding ducts of FIG. 11.

Referring to FIG. 12, as the electromagnetic absorption member 140 is provided on the inner surfaces of the primary shielding duct 100a and the secondary shielding duct 100b, the electromagnetic shielding performance may be further improved.

Figure 13:
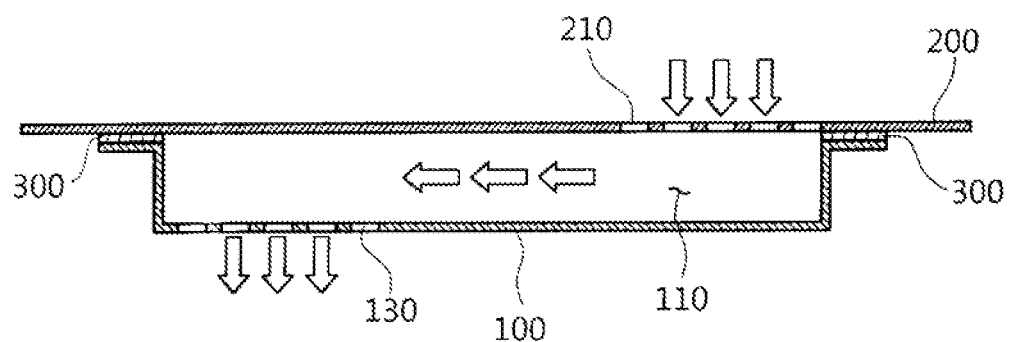
FIG. 13 illustrates a shielding duct in accordance with another embodiment of the present invention.

Meanwhile, when the direction along which the air heated inside the electronic device is discharged is limited by the space in which the electronic device is installed, the discharge port 130 may be formed on part of the top surface of the shielding duct 100, as illustrated in FIG. 13, instead of on one surface of the shielding duct 100. In this case, the direction of motion of the air discharged from the discharge port 130 may be set parallel to the direction of motion of the air discharged from the vent 210.

Figure 14:
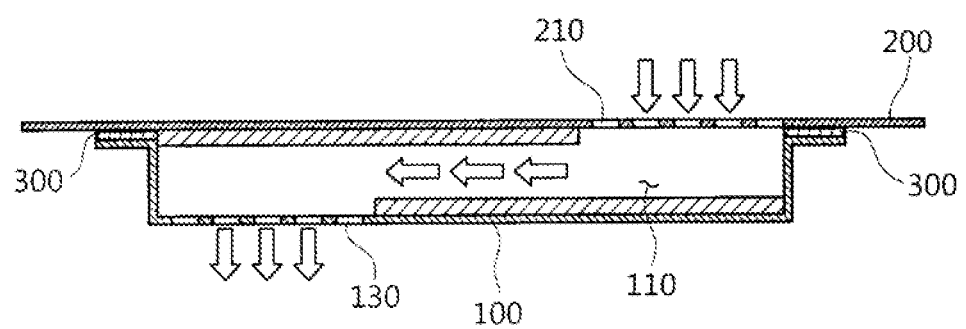
FIG. 14 schematically illustrates a state in which an electromagnetic wave absorption member is installed on the shielding duct of FIG. 13.

Furthermore, referring to FIG. 14, the electromagnetic wave absorption member 140 may be provided on the outer area of the shielding case 200, included in the shielding duct 100, as well as the inner surface of the shielding duct 100. In this case, the electromagnetic shielding performance may be further improved.

That is, as the vent structure for electromagnetic shielding in accordance with the embodiment of the present invention is used, the shielding duct may be additionally installed on the conventional shielding case 200, thereby improving the electromagnetic attenuation ability. Therefore, the electromagnetic shielding performance may be improved at a minimum cost.

Furthermore, the direction in which the air is discharged may be freely varied depending on the space in which the electronic device is installed. When the electronic device is installed in a narrow space that prohibits the installation of the shielding duct 100, the shielding duct 100 may be installed inside the shielding case 200.

Furthermore, the direction of the air discharged through the vent 210 may be freely varied. Therefore, in the case of electronic devices which are used close together in a residential space, the air may be prevented from being discharged into the residential space from the vent 210 located at a fixed position.

In accordance with the exemplary embodiments of the present invention, the vent structure for electromagnetic shielding may be mounted on the conventional shielding case. Therefore, since the vent structure for electromagnetic shielding in accordance with the embodiment of the present invention may be applied without replacing the shielding case, the cost may be reduced.

Furthermore, as electromagnetic waves generated from inside the electronic device are not directly discharged to the outside through the vent, but pass through the shielding duct mounted on the shielding case, the electromagnetic waves discharged from the electronic device may be effectively reduced.

Furthermore, as the shielding duct in accordance with the embodiment of the present invention discharges the air in a direction perpendicular to the vent, it is possible to prevent the heated air discharged from the electronic device from being transferred to a person or another electronic device installed adjacent thereto. Therefore, it is possible to prevent the person from feeling uncomfortable and prevent malfunctions or errors caused by the increase in internal temperature of another device.

Furthermore, the shielding duct may be installed inside and/or outside the shielding case. Even after the installation, the increase in volume is not large in comparison with the conventional shielding case. Therefore, the shielding duct in accordance with the embodiment of the present invention may be applied to a narrow space.

While the present invention has been described with respect to the specific embodiments, it will be apparent to those skilled in the art that various changes and modifications may be made without departing from the spirit and scope of the invention as defined in the following claims.

What is claimed is:

1. A vent structure for electromagnetic shielding, comprising:
   a conductive shielding case having a vent formed therein;
   a primary shielding duct installed inside the shielding case so as to cover the vent, having one side surface open in a direction perpendicular to the vent to form an introduction port through which air inside the shielding case is introduced, and comprising a first path formed to ventilate the air introduced into the introduction port in a direction perpendicular to the air discharged to the vent;
   a secondary shielding duct installed outside the shielding case so as to cover the vent, comprising a second path formed to ventilate the air in a direction perpendicular to the direction of the air discharged from the vent, and having a discharge port formed at an end of the second path so as to discharge the air introduced to the second path to the outside; and
   an EMI (Electro Magnetic Interference) gasket installed at bonding surfaces between the shielding case and the primary and secondary shielding ducts and electrically connecting the shielding case and the primary and secondary shielding ducts,
   wherein the introduction port of the primary shielding duct and the discharge port of the secondary shielding duct are installed to face each other.

2. The vent structure of claim 1, wherein the primary and secondary shielding ducts are formed in a rectangular shape in which the first and second paths are extended in the longitudinal direction thereof.

3. The vent structure of claim 1, wherein the primary and secondary shielding ducts further comprise an electromagnetic wave absorption member formed therein.

* * * * *